United States Patent
Ishida et al.

(10) Patent No.: US 6,785,148 B1
(45) Date of Patent: Aug. 31, 2004

(54) EASY MOUNT SOCKET

(75) Inventors: Kenzo Ishida, Tsukuba (JP); Shuji Inoue, Ibaraki-ken (JP); Kinya Ichikawa, Tsuchiura (JP); Kenji Takahashi, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/217,401

(22) Filed: Dec. 21, 1998

(51) Int. Cl.[7] .............................. H05K 7/10; H05K 7/12
(52) U.S. Cl. .................... 361/769; 361/785; 361/787; 361/803
(58) Field of Search .................... 361/767, 760, 361/761, 764, 769, 771, 785, 787, 789, 803, 736; 324/158; 228/180.2; 349/71, 66, 567; 439/71, 80–84, 65, 90, 91

(56) References Cited

U.S. PATENT DOCUMENTS

| | | | | |
|---|---|---|---|---|
| 4,620,761 A | * | 11/1986 | Smith et al. ................ | 439/372 |
| 4,705,205 A | * | 11/1987 | Allen et al. ............ | 228/180.22 |
| 4,898,173 A | * | 2/1990 | Daglow et al. ............. | 439/585 |
| 5,413,489 A | * | 5/1995 | Switky ........................ | 439/71 |
| 5,611,140 A | * | 3/1997 | Kulesza et al. ............... | 29/832 |
| 5,675,302 A | * | 10/1997 | Howard et al. ............. | 333/243 |
| 5,719,749 A | * | 2/1998 | Stopperan ................... | 174/254 |
| 5,800,184 A | * | 9/1998 | Lopergolo et al. ........... | 439/66 |
| 5,936,847 A | * | 8/1999 | Kazle ......................... | 361/771 |
| 6,046,597 A | * | 4/2000 | Barabi ........................ | 324/755 |
| 6,102,709 A | * | 8/2000 | Howard et al. ............... | 439/66 |
| 6,174,172 B1 | * | 1/2001 | Kazama ....................... | 439/66 |
| 6,264,476 B1 | * | 7/2001 | Li et al. ....................... | 439/66 |
| 6,524,115 B1 | * | 2/2003 | Gates et al. .................. | 439/66 |

* cited by examiner

*Primary Examiner*—David Nelms
*Assistant Examiner*—Thanh Y. Tran
(74) *Attorney, Agent, or Firm*—Schwegman, Lundberg, Woessner & Kluth, P.A.

(57) ABSTRACT

A socket for mounting a processor and/or a board has a substrate with a built in socket. The socket has conductive, elastically deformable terminals. The socket may be mounted to a processor and a board without using conventional surface mount technology, instead providing a mechanical contact mechanism between the socket and the board or processor. An adhesive layer may also be used to connect the socket to a processor and/or a board.

15 Claims, 6 Drawing Sheets

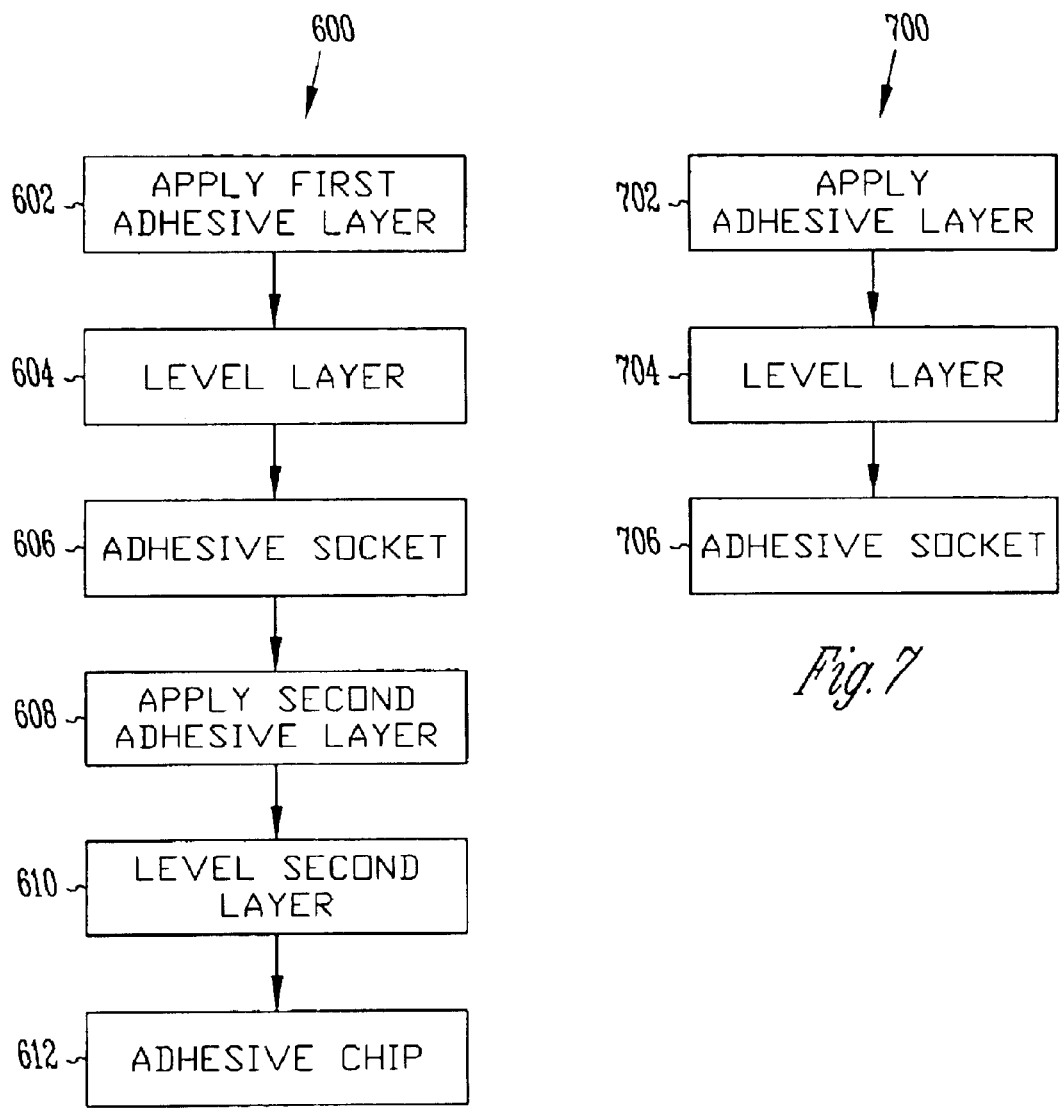

EASY MOUNT SOCKET

FIELD

The present invention relates generally to surface mount technology, and more specifically to non-solder solutions for surface mount technology.

BACKGROUND

A problem with conventional surface mount technology (SMT) is reflowing solder on a board or other circuit carrier to perform a surface mount connection. During reflow, the board solder, used for attaching the circuit board carrier to a surface mount assembly, is melted. Traditional solder melts at a temperature of approximately 183 degrees Centigrade. Other melt temperatures may be used, but a temperature higher than ambient temperature must be used to reflow solder. The reflowing process requires special equipment to generate the heat required to melt the board solder.

Additionally, personal computer manufacturers, who assemble computers from various parts, must generally keep parts stock on hand for assembly of computers. These personal computer manufacturers typically use a specific mounting process to mount chip cartridges to their own boards. Any cartridges or SMT technologies that are incompatible with the SMT used by the specific manufacturer will be disfavored by that manufacturer, as it can be quite expensive to change SMT strategies. Also, manufacturers of sockets and cartridges must currently manufacture parts capable of being used with specific SMT strategies. This results in increased production costs, as different lines and manufacturing processes must be used to manufacture different cartridge solutions.

For example, various packages for processors are currently used, and the type used depends on the specific user of the processor. For manufacturers that desire a component solution to supply only a processor instead of a processor package or cartridge, a narrow height socketable solution is desirable. Present technology uses a socket solution having an organic land grid substrate with a pin grid array interposer attached by SMT process. Pins are attached after that process. The total height of such a package is high. Customers desiring a processor only package do not want such a high height, and typically desire a processor package that is smaller in height than conventional processors.

Manufacturers using or desiring a cartridge type processor package want a socketable solution, and often are not concerned with the total height of the cartridge. However, such manufacturers are concerned with the available SMT processes available for use with the cartridge.

Variations in and warpage of substrates and boards decrease tolerance of conventional SMT to any inconsistencies and differences between parts. This can lead to decreased yield and manufacturability of sockets and boards, as well as poor or reduced performance and reliability. Problems may occur in creating a good electrical contact between a socket and a board. Further, stresses placed on the assembled board during use and installation may also contribute to a weakening of the contact between a socket and a board.

Also, problems exist with increasing the amount of pressure required to mount a processor in a socketable solution. To get a good electrical contact, a certain amount of force must be applied to the processor. This force is typically stated as a force per pin. As the amount of force per pin increases, it becomes increasingly more difficult to mount processors in a socketable solution by hand. As more machinery is required, assembly costs and complexity of assembly increase.

Thermal transfer of generated heat from a processor has been accomplished within the microprocessor and computer industry by using a metal cover for the processor package or cartridge. This cover fits over and around the processor or cartridge to dissipate heat from the processor.

SUMMARY

A mounting socket embodying the invention includes a socket body having a first side and a second, opposite side, the body having a number of vias or through holes, and a number of conductive terminals within the vias. The terminals are made from an elastically deformable member.

In another embodiment, a mounting socket has a substrate with vias or through holes in the substrate, and conductive terminals within the substrate. An adhesive layer is applied to the board side of the socket to attach the socket to a circuit or motherboard. Another adhesive layer is applied to the opposite side of the socket for attachment of the socket to a processor.

A method of mounting a socket to a board includes applying an adhesive layer to a board side of the socket, leveling the adhesive layer to make the adhesive layer substantially coplanar with contact terminals of the socket so as to avoid the adhesive interfering with the electrical contact between the terminals and the board, and adhering the socket to the board.

BRIEF DESCRIPTION OF THE DRAWINGS

FIG. 6 is a flow chart diagram of a method embodiment of the invention; and

FIG. 7 is a flow chart diagram of another method embodiment of the invention.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
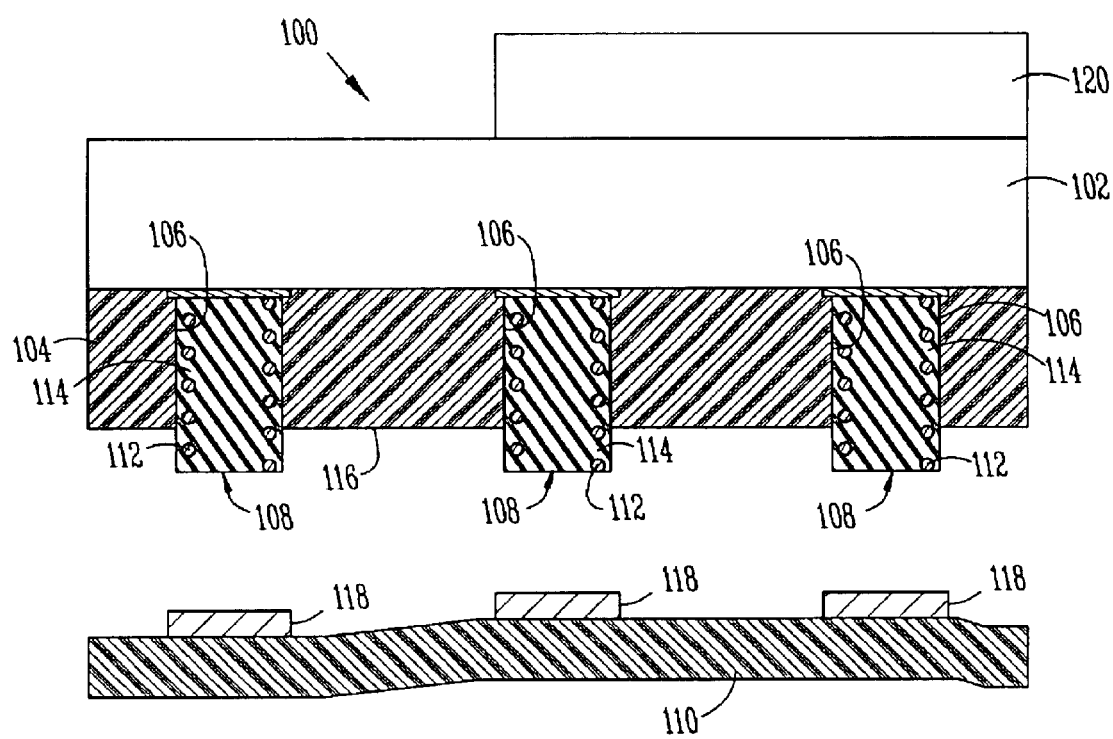
FIG. 1 is a partial cross-sectional view of an embodiment of the invention.

Referring now to the drawings, FIG. 1 shows a surface mount assembly 100 having a substrate 102 with a built-in socket 104. The built-in socket 104 is attached to the substrate 102. Within the built-in socket 104 are vias 106 within which are formed or placed contact terminals 108. Contact terminals 108 are soft contact terminals which are elastically deformable and which allow a mechanical contact to be made between the terminal and a circuit board 10 without requiring a full height solution. This embodiment 100 may be mounted to a board with conventional SMT processes or socketable solutions. The assembly 100 may also be mounted to a chip or processor 120, such as the Pentium® and Pentium® II line of processors available from Intel Corp. of Santa Clara, Calif. However, the socket is not limited to any particular processor, but may be modified to accommodate any processor. This allows original equipment manufacturers (OEMs) the flexibility to use the embodiment 100 with their existing board mounting process, whatever that process may be.

The soft contact terminals 108 are conductive and independently elastically deformable, so that when they are compressed, they will exert a return force, and allow for a lower required mounting force per pin for making electrical contact between the socket 104 and the board 110. Soft contact terminals 108 may comprise any number of conductive terminals which are elastically deformable, including but not limited to a spring member such as a coil, a combination coil and metal plunger, or a dish spring. Preferably, soft contact terminals 108 comprise a spring or other coil 112 and a conductive polymer 114 injected or placed around the coil. Any conductive polymer may be used in soft contact terminals 108.

While terminals 108 have been described herein as within the vias 106, at least a portion of the terminals 108 may be situated so that they are outside vias 106. For example, for one embodiment, a portion of the plurality of terminals 108 may be within the vias 106, and a portion of the plurality of terminals may be situated outside the vias 106.

Figure 2:
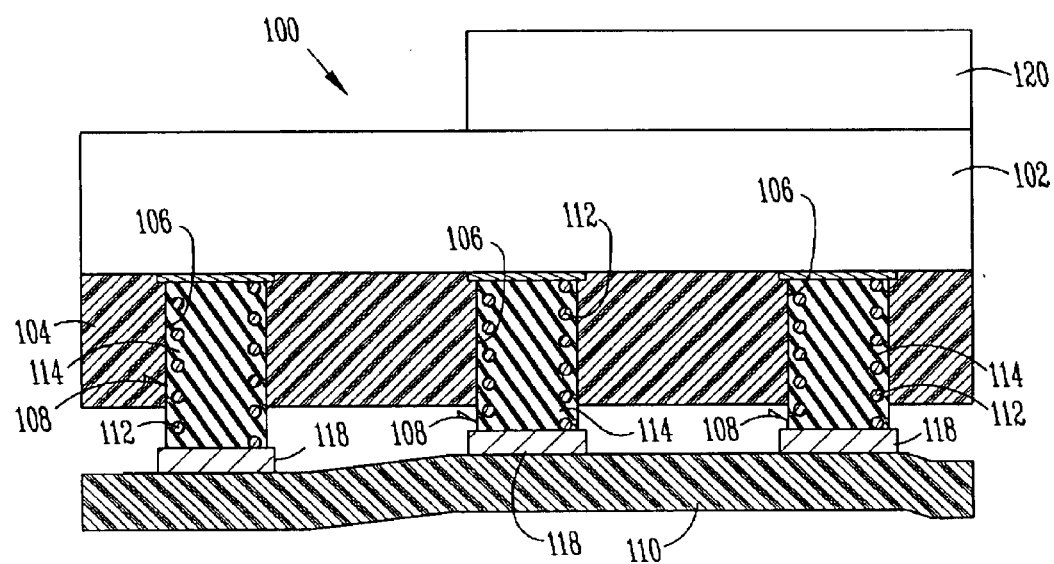
FIG. 2 is a partial cross-sectional view of an embodiment of FIG. 1 attached to a board.

Board and socket substrate warpage are accounted for by the compressibility of the terminals 108. As seen in FIG. 1, terminals 108 preferably extend beyond the plane 116 defining the bottom of the socket 104. When the socket 104 is mounted to a board 110 having pads or lands 118, the compressible soft contact terminals 108 will adjust to the height of the lands or pads 118 as shown in FIG. 2, making good electrical contact despite warpage of the board 110. A board such as board 110 may be warped, resulting in the lands 118 being positioned on multiple planes at different levels. For example, on board 110 in FIGS. 1 and 2, lands 118 are shown to be at three different levels due to warpage of the board 110. Inconsistencies in manufacture and physical conditions such as heat, storage, and aging, may all lead to board warpage.

Each terminal 108 is the same in undeformed length. Each terminal is individually deformable, and the individual compressibility of terminals 108 allows for each terminal 108 to make a solid electrical contact with its respective land 118, despite the lands 118 being at different distances from the substrate 102 in final assembled form. As is seen in FIG. 2, each of the three terminals 108 shown has a different compressed length which depends on the position of the individual land 118 with which the terminal 108 is making contact. Warpage of the board is compensated for by the individually adjustable terminals 108.

This configuration results in a lower force per pin for making a good electrical contact between the assembly 100 and the board 110. With less pressure required to mount the assembly 100 to the board 110, mounting may be accomplished by hand or with little mechanical assistance. Reduction in the stress applied to the assembly 100 also results in increased reliability.

The soft contact terminals 108 create a good electrical contact with lands or pads 118 on board 110 using the shortest contact 108 length to the board 110. Good electrical performance including low inductance follows.

A chip or package 120 may be mounted to the substrate 102 on the opposite side of substrate 102 as socket 104. A thermal transfer plate comprising a metal push cover and back plate may encapsulate the assembly 100 as is known in the art. The thermal transfer plate is conventional in size, and the assembly 100 conforms to the thermal transfer plate. No changes need to be made to the thermal transfer plate to accommodate the assembly 100 with board 110 and chip 120 attached.

A low height solution for mounting to a manufacturer supplied board comprises substrate 102 with built-in socket 104 having soft contact terminals 108. A processor or chip 120 may be mounted to the substrate 102. The mounting of the assembly 100 to a board 110 may be accomplished using standard SMT soldering processes, or using room temperature SMT socketing solutions. The assembly lends itself to the process the manufacturer desires to use.

The assembly 100 is constructed as follows. A chip 120 is attached to a substrate 102. A third layer, socket 104, is attached to the substrate 102. Socket 104 has terminal vias 106 for holding terminals 108. Terminals 108 preferably comprise a spring 112 with injected conductive polymer 114. The socket 104 of the assembly 100 may be applied into a processor cartridge, reducing overall height of the cartridge or processor assembly, and can accommodate any type of back side board to which the assembly or processor package is to be mounted.

The assembly 100 eliminates the previous need for one socket side for mounting to a board, and one socket side for mounting to a chip or package. The two socket design is replaced by a single socket design as is discussed above. The socket for mounting to a board is integrated into the substrate, creating a single socket component with reduced height and increased flexibility in mounting. The soft contact terminals reduce the mounting force required to mount the assembly to a board. Conventional SMT processes or non-solder socketable mounting solutions may each be employed with the socket package 100.

Figure 3:
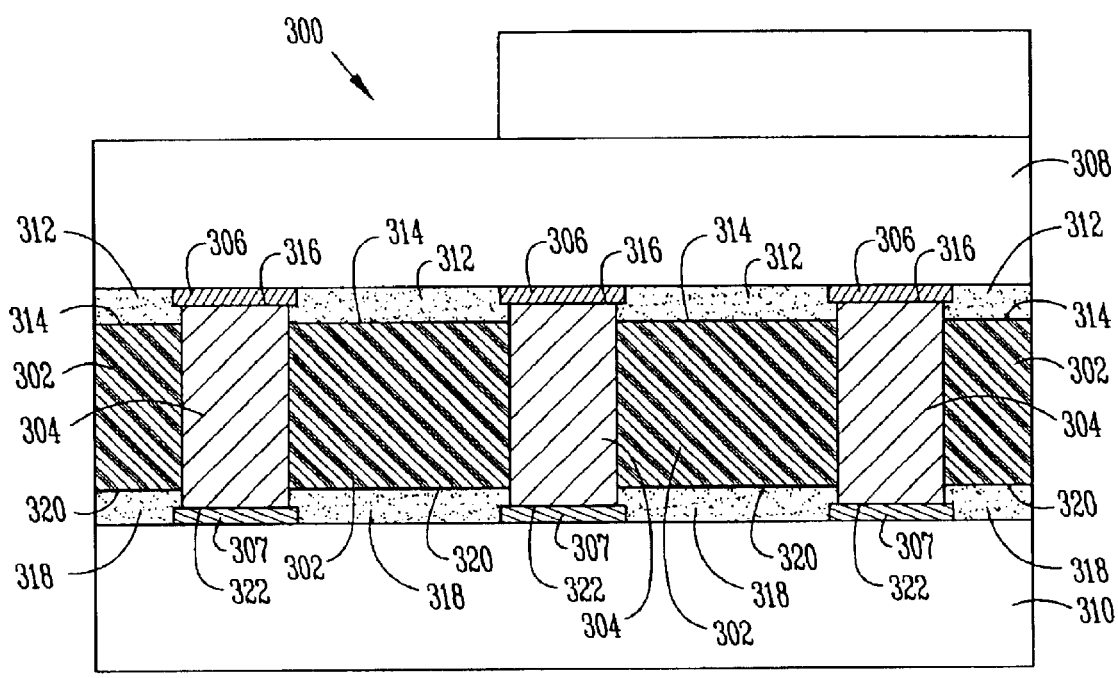
FIG. 3 is a cross-sectional view of another embodiment of the invention.

FIG. 3 shows another SMT socket assembly 300. Assembly 300 is a low cost alternative to demountable socket assemblies. Assembly 300 comprises a socket 302 having terminals 304. A package 308 and a board 310 are attachable to the assembly. Terminals 304 may have pads or lands 306 and 307 for electrical attachment to a package 308 and board 310, respectively. Alternatively, package 308 and/or board 310 may have pads or lands 306. Socket 302 may be any type of socket such as a traditional socket or a socket such as socket 104 with soft contact terminals 108 as described above.

A layer of adhesive 312 on the package side 314 of assembly 300 is used to attach assembly 300 to package 308. Adhesive 312 is applied to top surface 314 of socket 302 to facilitate the attachment of assembly 300 to package 308. Openings in adhesive layer 312 are left so that electrical contact may be made between assembly 300 and package 308 without adhesive interference at lands 306 and/or terminal ends 316.

A layer of adhesive 318 on the board side 320 of assembly 300 is used to attach assembly 300 to board 310. Adhesive 318 is applied to bottom surface 320 of socket 302 to facilitate the attachment of assembly 300 to board 310. Openings in adhesive layer 318 are left so that electrical contact may be made between assembly 300 and board 310 without adhesive interference at lands 307 and/or terminal ends 322.

Any adhesive will function as adhesive 312 and adhesive 318, providing it has sufficient adhesion to connect and keep connected assembly 300 to package 308 and board 310. By way of example but not limitation, adhesives used for bonding metal to metal have sufficient adhesion to accomplish the connection of assembly 300 to package 308 and board 310.

Figure 4:
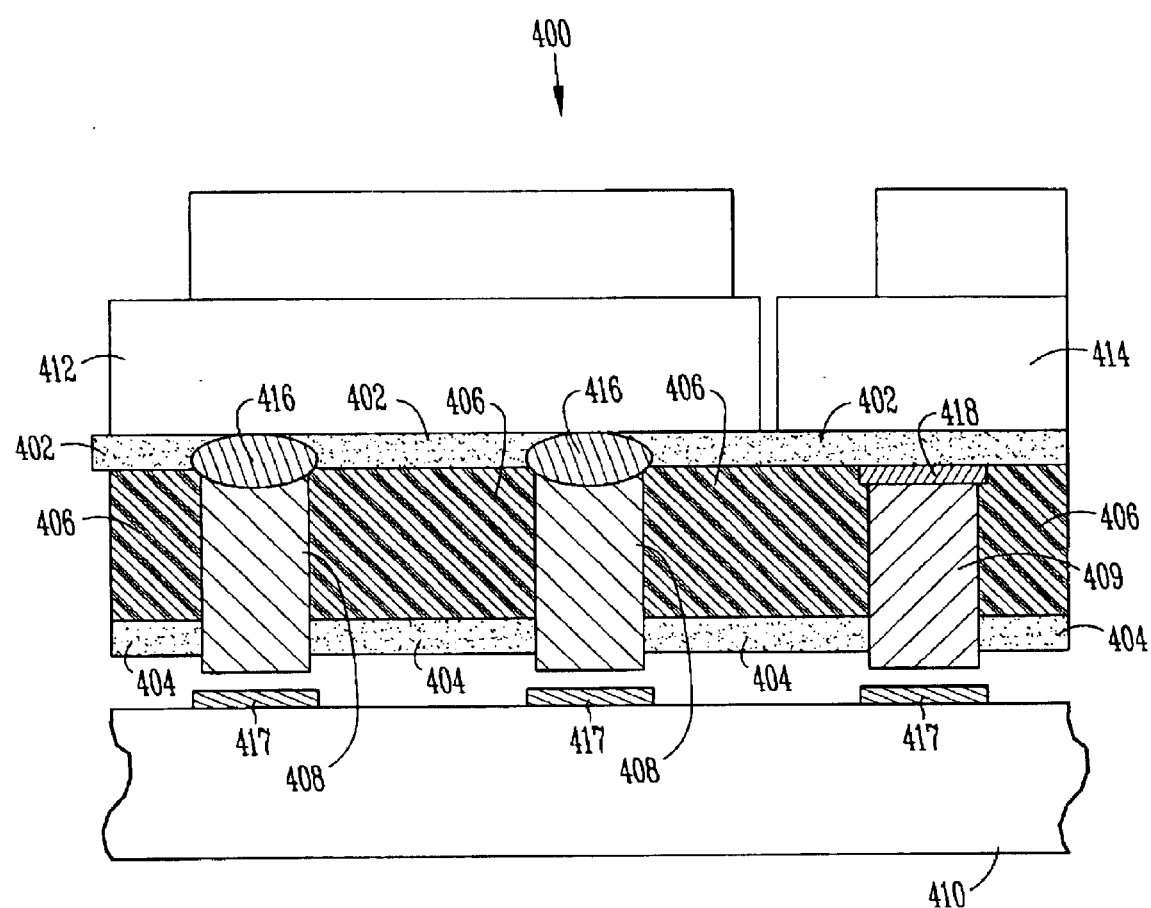
FIG. 4 is a cross-sectional view of yet another embodiment of the invention.

As seen in FIG. 4, adhesive layers 402 and 404 may be used to attach another alternative assembly 400 comprising a socket 406 with terminals 408 and 409 to a board 410, and to different packages 412 and 414. Adhesive layer 404 physically attaches assembly 400 to board 410. Electrical contact is made between board 410 and terminals 408 and 409 through lands 417 on board 410. The socket 406 may be any type of socket such as a traditional socket or a socket such as socket 104 with soft contact terminals 108 as described above.

Package 412 is shown as a ball grid array (BGA) package, and package 414 is shown as a land grid array (LGA) package. BGA package 412 electrically attaches to assembly 400 via solder balls 416 to make an electrical connection between BGA package 412 and terminals 408. Physical attachment of assembly 400 to BGA package 412 is accomplished with adhesive 402, and does not require a solder reflow process. LGA package 414 electrically attaches to assembly 400 via land 418 to make an electrical connection between LGA package 414 and terminal 409. Physical attachment of assembly 400 to LGA package 414 is accomplished with adhesive 402, and does not require a solder reflow process.

Adhesive 402 attaches assembly 400 to packages such as package 412 and package 414. Attachment with adhesive 402 requires no special machinery or high temperature. Instead, attachment may be accomplished at room temperature.

Figure 5:
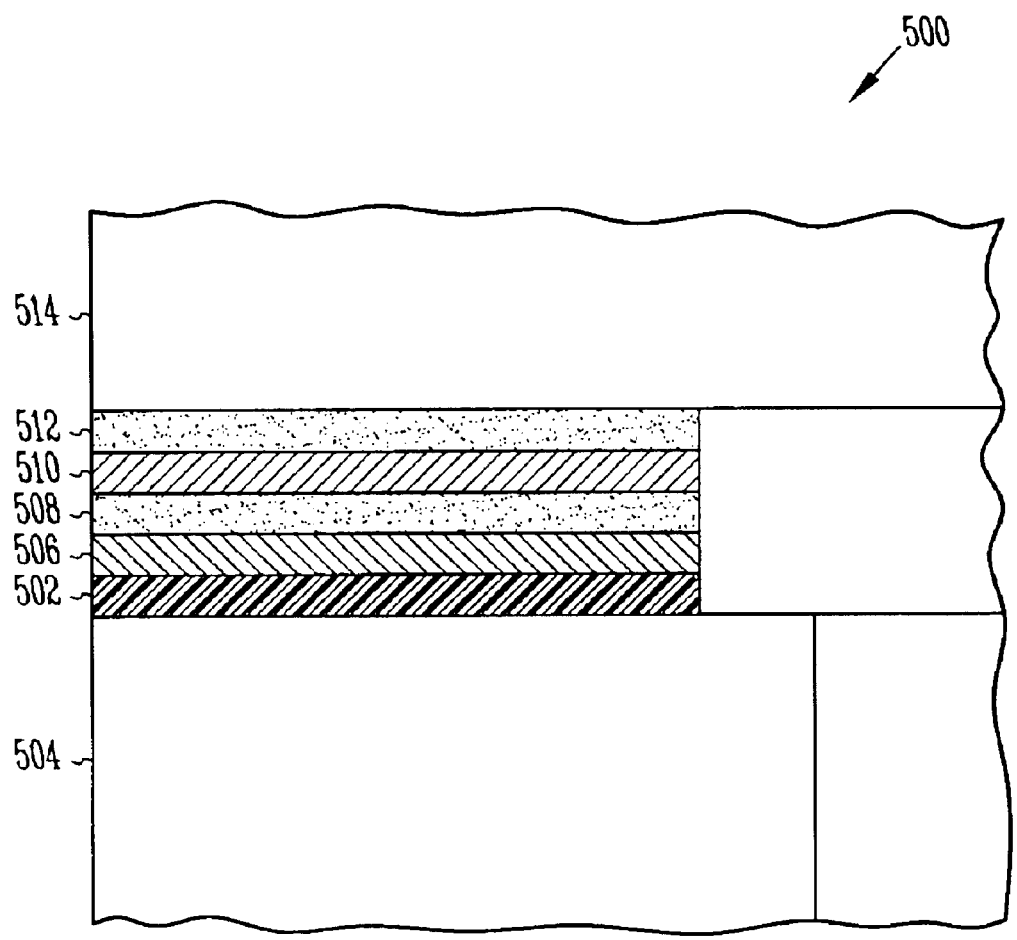
FIG. 5 is a partial cross-sectional view of still another embodiment of the invention.

In another alternative embodiment 500, best shown in FIG. 5, re-patterning of ground and power lines is accomplished by using layers of polymer like tape, copper or other conductive lines, and adhesive layers. As shown in FIG. 5, a layer of polymer like tape 502 is applied to a substrate 504. On the tape 504, copper or other conductive metal line 506 is laid. The line 506 may be a ground (GND) or power (PWR) line, or in fact may be an entire pattern of lines. An adhesive layer 508 is applied over the line or lines 506, sealing the lines electrically from a next layer of conductive lines 510 laid on the adhesive layer 508. Multiple layers of ground/power lines with extra layers of adhesive in a stacked pattern may be applied in this manner, allowing the creation of a flexible socket package with re-patterned ground and power lines. A final layer of adhesive 512 is applied to the top layer of re-patterned GND/PWR lines, allowing attachment of the assembly 500 to a package such as package 514. Electrical connection may be made as described above, using standard SMT processes, or other processes, such as mechanical attachment as described above using soft contact terminals.

The assembly of sockets to packages and to boards is made more easily and more quickly using the embodiments described above with reference to FIGS. 1–5. The embodiments described above may easily be mounted at room temperature, with no high temperature reflow processes required. The assemblies of the embodiments described above are compatible with existing thermal transfer covers used with processors and processor packages, and require no re-tooling of traditional thermal transfer plates and covers. OEMs can use their existing SMT processes for mounting embodiments of the invention, and need not change to accommodate the embodiments. The sockets described herein may be mounted by hand, with reduced amounts of pressure per pin due to the soft contact terminals. Because no traditional high temperature SMT processes are required using the embodiments of the invention, assembly of components is accomplished more quickly than traditional assembly. There is no waiting time required for cool down of the components after a traditional high temperature solder reflow.

Referring now to FIG. 6, a method 600 of mounting a socket assembly to a package and a board comprises applying a first adhesive layer to the socket 602, leveling the adhesive layer 604 so that the contact terminals of the socket are not obstructed by adhesive, and adhering a package to the socket assembly 606. The method 600 further comprises applying a second adhesive layer to the socket 608 on the side opposite the first adhesive layer, leveling the second adhesive layer 610 so that the contact terminals of the socket are not obstructed by adhesive, and adhering the socket assembly to the board 612.

Referring to FIG. 7, a method 700 of mounting a socket assembly to a board comprises applying an adhesive layer to the socket assembly 702, leveling the adhesive layer 704, and adhering the socket to the board 706. In leveling the adhesive layer 704, the contacts of the socket assembly are left without adhesive so that the contacts are not obstructed with adhesive, and so that a good electrical contact can be made. The adhesive may be applied using a mask or other barrier to prevent the adhesive from covering or otherwise obstructing the lands or electrical contacts of the terminals.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A mounting socket, comprising:
   a body having first and second sides, and having a plurality of vias extending from a first side to a second side;
   a plurality of conductive terminals within the vias, each terminal including
      a spring extending through one of the vias and adapted to exert a return force when compressed,
      a conductive polymer in contact with the spring and with the one via;
   a first adhesive layer affixed to the first side of the body;
   a polymer tape applied to the first adhesive layer;
   a ground and power line circuit on the polymer tape.

2. The mounting socket of claim 1 where the spring is a coil.

3. The mounting socket of claim 2 where the conductive polymer is deformable when the spring is compressed.

4. The mounting socket of claim 1 where the vias have a constant width.

5. The mounting socket of claim 1 where the conductive polymer fills the vias from side to side.

6. The mounting socket of claim 5 where the conductive polymer fills the vias from end to end.

7. The mounting socket of claim 1 where the terminals extend beyond the first and second sides of the body.

8. The mounting socket of claim 1 where the terminals are solderless.

9. The mounting socket of claim 1 further comprising a second adhesive layer applied over the ground and power line circuit.

10. The mounting socket of claim 1 further comprising a further adhesive layer affixed to the second side of the body.

11. A circuit assembly, comprising:
   a substrate having a plurality of lands thereon;
   a socket body having a first side in contact with the substrate, and having an opposite side;
   a plurality of vias extending from the first side to the opposite side;
   a plurality of conductive terminals within the vias and contacting the lands, each terminal including
      a spring extending through one of the vias and adapted to exert a return force when compressed,
      a conductive polymer in contact with the spring and with the one via;
   an adhesive layer bonding the socket body to the substrate;
   a polymer tape applied to the adhesive layer;
   a ground and power line circuit on the polymer tape.

12. The circuit assembly of claim 11 where the conductive terminals exert a force upon the lands.

13. The circuit assembly of claim 11 further comprising an integrated circuit coupled to the substrate.

14. The circuit assembly of claim 13 further comprising a circuit board contacting the opposite side of the socket body.

15,. The circuit assembly of claim 14 further comprising another adhesive layer on the opposite side of the socket body bonding it to the circuit board.

* * * * *

UNITED STATES PATENT AND TRADEMARK OFFICE
CERTIFICATE OF CORRECTION

PATENT NO. : 6,785,148 B1
DATED : August 31, 2004
INVENTOR(S) : Ishida et al.

It is certified that error appears in the above-identified patent and that said Letters Patent is hereby corrected as shown below:

Column 8,
Line 11, delete "15,." and insert -- 15. --, therefor.

Signed and Sealed this

First Day of February, 2005

JON W. DUDAS
*Director of the United States Patent and Trademark Office*